US006985023B2

(12) United States Patent
Kawabata et al.

(10) Patent No.: US 6,985,023 B2
(45) Date of Patent: Jan. 10, 2006

(54) SELECTIVE SWITCHING OF A TRANSISTOR'S BACK GATE POTENTIAL

(75) Inventors: Mami Kawabata, Yokohama (JP); Masahiro Yoshihara, Yokohama (JP); Eiichi Makino, Round Rock, TX (US)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/768,394

(22) Filed: Jan. 30, 2004

(65) Prior Publication Data

US 2004/0227566 A1 Nov. 18, 2004

(30) Foreign Application Priority Data

Jan. 31, 2003 (JP) ...................................... 2003-023324

(51) Int. Cl.
*H03K 19/0185* (2006.01)
*H03K 17/687* (2006.01)

(52) U.S. Cl. ........................................ 327/534; 327/537

(58) Field of Classification Search ................. 327/407, 327/408, 534, 535, 537, 544
See application file for complete search history.

(56) References Cited

U.S. PATENT DOCUMENTS 5,467,048 A 11/1995 Watanabe ................... 327/436
5,966,043 A * 10/1999 Jinbo ......................... 327/530
RE37,217 E 6/2001 Kobayashi .................. 330/255
6,242,971 B1 * 6/2001 Manstretta et al. ......... 327/537
6,333,571 B1 * 12/2001 Teraoka et al. ............. 307/125
6,469,568 B2 * 10/2002 Toyoyama et al. .......... 327/534

FOREIGN PATENT DOCUMENTS

| | | |
|---|---|---|
| JP | 04-000753 | 1/1992 |
| JP | 07-131332 | 5/1995 |

* cited by examiner

*Primary Examiner*—Timothy P. Callahan
*Assistant Examiner*—Terry L. Englund
(74) *Attorney, Agent, or Firm*—Hogan & Hartson, LLP

(57) ABSTRACT

A semiconductor device comprises a first transistor and a potential generator circuit. The first transistor has a first conduction type first semiconductor region and a second conduction type second semiconductor region formed in the first semiconductor region. The first and second semiconductor regions are supplied with first and second prescribed potentials, respectively. The potential generator circuit generates the first prescribed potential. The potential generator circuit has a first power supply terminal supplied with a first power supply potential, a second power supply terminal supplied with a second power supply potential set to a higher potential than the first power supply potential, and an output terminal outputting the first prescribed potential. The potential generator circuit outputs the second power supply potential when the second power supply potential is higher than a predetermined potential, and the first power supply potential when the second power supply potential is lower than the predetermined potential.

17 Claims, 2 Drawing Sheets

SELECTIVE SWITCHING OF A TRANSISTOR'S BACK GATE POTENTIAL

CROSS-REFERENCE TO RELATED APPLICATIONS

This application is based upon and claims the benefit of priority from the prior Japanese Patent Application No. 2003-023324, filed Jan. 31, 2003, the entire contents of which are incorporated herein by reference.

BACKGROUND OF THE INVENTION

1. Field of the Invention

The present invention relates to a semiconductor device, and in particular, to a semiconductor device having a P-channel transistor to which a well voltage is applied.

2. Description of the Related Art

In semiconductor memory devices, a control circuit controlling memory cells is formed around the memory cells. The control circuit comprises elements such as a transistor or diode. For example, the control circuit is composed of a P-channel transistor 40 shown in FIG. 5. The P-channel transistor 40 is formed in a substrate or well formed in the substrate, and supplied with well voltage (back gate voltage) VB in addition to gate voltage VG, source voltage VS and drain voltage VD. The Source voltage VS is supplied from a first power supply and it is a power supply potential Vcc. The Well voltage VB is supplied from a second power supply formed of a charge-pump circuit in the semiconductor memory device, and it is usually a boosted potential Vpp. That is, $VB=Vpp\geqq VS=Vcc$.

As illustrated in FIG. 6, the P-channel transistor 40 comprises first semiconductor region 51, P-type second semiconductor regions 52, 53, and gate electrode 54. The first semiconductor region 51 is formed of an N-type well or N-type semiconductor substrate. The P-type second semiconductor regions 52 and 53 are formed in the first semiconductor region 51, and constitute source and drain regions of the P-channel transistor 40. The gate electrode 54 is formed on the first semiconductor region 51 via a gate insulating film. The gate electrode 54, second semiconductor regions 52, 53 and first semiconductor regions 51 are supplied with gate voltage VG, source voltage VS, drain voltage VD and well voltage VB, respectively.

JPN. PAT. APPLN. KOKAI Publication No. 7-131332 is given as the document relevant to a CMOS circuit having the following structure. According to the structure, P-channel and N-channel MOS transistors are connected in series, and the node between both MOS transistors is used as an output terminal. In FIG. 1 of the foregoing publication, there is shown a circuit, which blocks a reverse current from the output side so that undesired current cannot be carried.

FIG. 5 and FIG. 6 are a circuit diagram and cross-sectional view showing a conventional semi-conductor device. In a P-channel transistor 40, well voltage VB is usually set to a voltage higher than source voltage VS. However, if many cells are operated and a large current flows through a power supply supplying boosted potential Vpp, the boosted potential falls; for this reason, the well voltage VB becomes lower than the source voltage VS. In addition, when noise is generated, the boosted potential falls; for this reason, the well voltage VB becomes lower than the source voltage VS. When the potential of the boosted potential falls and the well voltage VB becomes lower than the source voltage VS by the threshold value of the PN junction between source and well, the PN junction between source and well is forward-biased; therefore, it turns on. As seen from the arrows shown in FIG. 6, a large numbers of carriers are generated in a substrate. For this reason, there is a problem that a parasitic transistor comprising substrate, source and well latches up, and large current flows therethrough.

BRIEF SUMMARY OF THE INVENTION

According to an aspect of the present invention, there is provided a semiconductor device comprising:

a first transistor having a first conduction type first semiconductor region and a second conduction type second semiconductor region formed in the first semi-conductor region, the first semiconductor region being supplied with a first prescribed potential, the second semiconductor region being supplied with a second prescribed potential; and a potential generator circuit generating the first prescribed potential, wherein the potential generator circuit has a first power supply terminal supplied with a first power supply potential, a second power supply terminal supplied with a second power supply potential set to a higher potential than the first power supply potential, and an output terminal outputting the first prescribed potential, and the potential generator circuit outputs the second power supply potential as the first prescribed potential when the second power supply potential is higher than a predetermined potential, and outputs the first power supply potential as the first prescribed potential when the second power supply potential is lower than the predetermined potential.

According to another aspect of the present invention, there is provided a semiconductor device comprising:

a first transistor having a first conduction type first semiconductor region and a second conduction type second semiconductor region formed in the first semiconductor region, the first semiconductor region being supplied with a first prescribed potential, the second semiconductor region being supplied with a second prescribed potential; and a potential generator circuit generating the first prescribed potential, wherein the potential generator circuit has a first power supply terminal supplied with a first power supply potential, a second power supply terminal supplied with a second power supply potential set to a higher potential than the first power supply potential, and an output terminal outputting the first prescribed potential, and the potential generator circuit comprises:

a second transistor having a source connected to the second power supply terminal supplied with the second power supply potential, and a drain connected to the output terminal outputting the first prescribed potential;

a third transistor having source and gate connected to the first power supply terminal supplied with the first power supply potential, and a drain connected to the output terminal outputting the first prescribed potential; and an inverter circuit having an input terminal connected to the second power supply terminal, and an output terminal connected to the gate of the second transistor.

According to a further aspect of the present invention, there is provided a semiconductor device comprising:

a first transistor having a first conduction type first semiconductor region and a second conduction type second semiconductor region formed in the first semiconductor region, the first semiconductor region being supplied with a first prescribed potential, the second semiconductor region being supplied with a second prescribed potential; and a potential generator circuit generating the first prescribed potential, wherein the potential generator circuit has a first power supply terminal supplied with a first power supply potential, a second power supply terminal supplied with a second power supply potential set to a higher potential than the first power supply potential, and an output terminal outputting the first prescribed potential, and the potential generator circuit comprises:

a second transistor having a source connected to the second power supply terminal supplied with the second power supply potential, and a drain connected to the output terminal outputting the first prescribed potential;

a third transistor having source and gate connected to the first power supply terminal supplied with the first power supply potential, and a drain connected to the output terminal outputting the first prescribed potential; and a comparator circuit including a differential amplifier circuit having a pair of input terminals and an output terminal;

wherein one of the pair of input terminals of the differential amplifier circuit of the comparator circuit is connected with the first power supply terminal, the other thereof is connected with a source of a fourth transistor having drain and gate both connected to the first power supply terminal, and the output terminal of the differential amplifier circuit of the comparator circuit is connected to the gate of the second transistor.

DETAILED DESCRIPTION OF THE INVENTION

Embodiments of the present invention will be described below with reference to the accompanying drawings.

(First Embodiment)

A semiconductor device according to a first embodiment of the present invention will be explained below with reference to FIG. 1 to FIG. 3.

Figure 2:
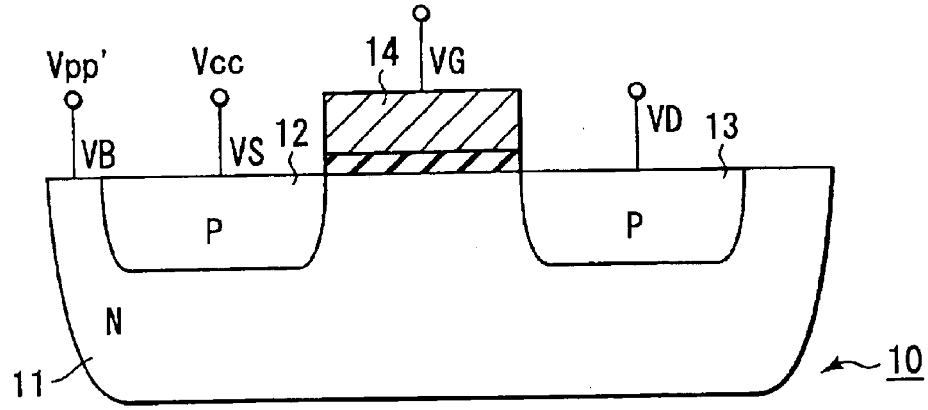
FIG. 2 is a cross-sectional view showing the semiconductor device of FIG. 1.
Figure 1:
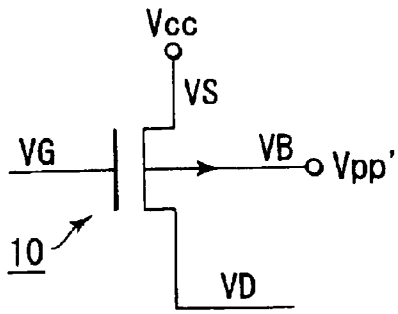
FIG. 1 is a circuit diagram showing a semiconductor device.
Figure 5:
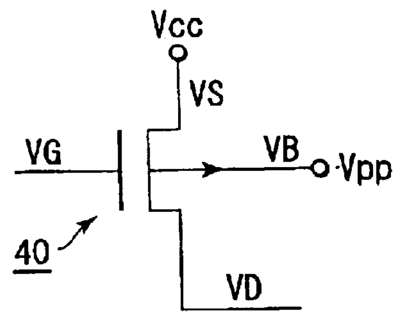
FIG. 5 is a circuit diagram and showing a conventional semiconductor device.
Figure 6:
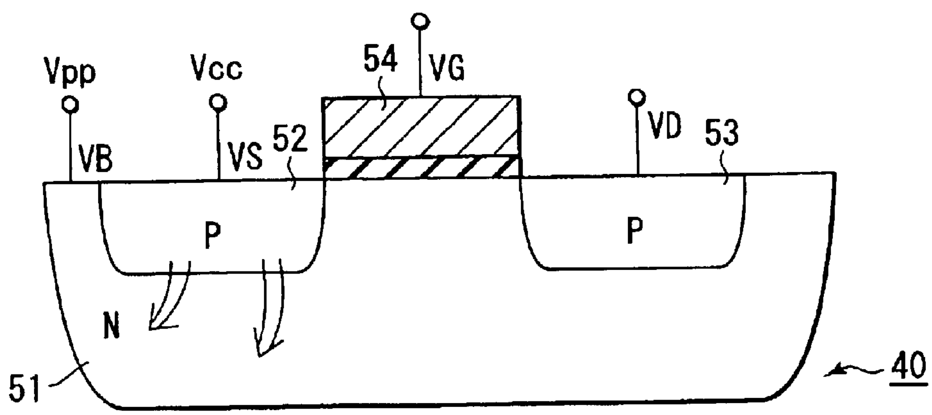
FIG. 6 is a cross-sectional view showing the conventional semiconductor device of FIG. 5.
Figure 3:
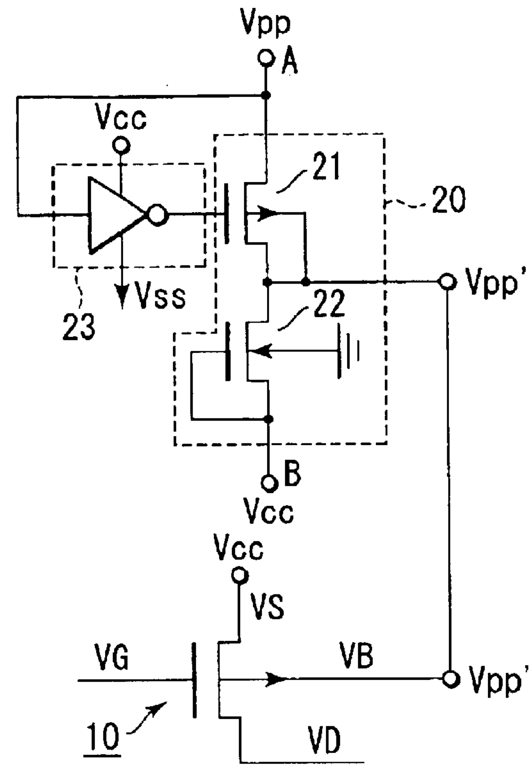
FIG. 3 is a circuit diagram showing a semiconductor device according to a first embodiment of the present invention.

FIG. 1 is a circuit diagram showing a semi-conductor device, FIG. 2 is a cross-sectional view showing the semiconductor device of FIG. 1, and FIG. 3 is a circuit diagram showing a semiconductor device according to the first embodiment of the present invention.

In semiconductor memory devices, a control circuit controlling memory cells is formed around the memory cells. The control circuit comprises elements such as a transistor or diode. For example, the control circuit is composed of a P-channel transistor 10 shown in FIG. 1. The P-channel transistor 10 is formed in a substrate or well formed in the substrate, and supplied with well voltage (back gate voltage) VB in addition to gate voltage VG, source voltage VS and drain voltage VD. The voltage VB is not limited to the well voltage, and a substrate voltage may be supplied.

As illustrated in FIG. 2, the P-channel transistor 10 comprises first semiconductor region 11, P-type second semiconductor regions 12, 13, and gate electrode 14. The first semiconductor region 11 is formed of an N-type well or N-type semiconductor substrate. The P-type second semiconductor regions 12 and 13 are formed in the first semiconductor region 11, and constitute source and drain regions of the P-channel transistor 10. The gate electrode 14 is formed on the first semiconductor region 11 via a gate insulating film. The gate electrode 14, second semiconductor regions 12, 13 and first semiconductor regions 11 are supplied with gate voltage VG, source voltage VS, drain voltage VD and well voltage VB, respectively.

Controlled boosted potential Vpp' is supplied as the well voltage VB of the P-channel transistor 10. A well voltage generator circuit shown in FIG. 3 generates the controlled boosted potential Vpp'. The well voltage generator circuit is provided with terminals A and B. The terminal A receives boosted potential Vpp supplied from a second power supply comprising a charge pump circuit (not shown) in the semiconductor memory device. On the other hand, the terminal B receives power supply potential Vcc supplied from a first power supply. The controlled boosted potential Vpp' is outputted from an output terminal. A potential switching circuit 20 is interposed between the terminals A and B. The potential switching circuit 20 has the configuration in which a P-channel transistor 21 and an N-channel transistor 22 are connected in series between the terminals A and B. The terminal A is provided with the P-channel transistor 21; on the other hand, the terminal B is provided with the N-channel transistor 22. The source and gate of the N-channel transistor 22 are connected, that is, diode-connected.

The terminal A is connected with the source of the P-channel transistor 21, and the gate of the P-channel transistor is connected to the output of an inverter circuit 23. The input of the inverter circuit 23 is connected to the terminal A. The back gate and drain of the P-channel transistor 21 are interconnected. The inverter circuit 23 comprises a CMOS circuit, and is connected to first power supply potential Vcc and reference potential Vss (e.g., ground potential).

The terminal B is connected with the source of the N-channel transistor 22. The source and gate of the N-channel transistor 22 are interconnected, that is, diode-connected. The well voltage (back gate voltage) of the N-channel transistor 22 is reference voltage Vss; for example, ground potential. The voltage of the common drain of interconnected P-channel and N-channel transistors 21 and 22 is applied as well voltage VB to the well of the P-channel transistor 10. The threshold Vthn of the N-channel transistor 22 is about 0.2 V to 0.3 V, for example. The threshold Vthp of the P-channel transistor 21 is about 0.6 V, for example. P-channel and N-channel transistors 21 and 22 constituting the well voltage generator circuit are provided for generating the well voltage. The current flow rate is relatively low; therefore, the P-channel and N-channel transistors 21 and 22 form a low-consumption type circuit.

The operation of the well voltage generator circuit shown in FIG. 3 will be explained below. If the voltage Vpp of the terminal A is higher than the voltage Vcc of the terminal B, that is, Vpp≧Vcc, the P-channel transistor 21 turns on while the N-channel transistor 22 turns off. Thus, the output voltage of the potential switching circuit 20, that is, the controlled boosted potential Vpp' is equal to Vpp (Vpp'=Vpp). Therefore, the well voltage VB is equal to Vpp (VB=Vpp).

For example, a great many cells are operated; for this reason, a large current flows through the power supply supplying the voltage Vpp to the terminal A, or noise is generated. In this case, the boosted potential Vpp becomes low. When the voltage Vpp becomes lower than (Vcc−Vthn), the N-channel transistor 22 comprising a transistor having a low threshold voltage turns on, and When the voltage Vpp becomes lower than the circuit threshold of the inverter circuit 23, the P-channel transistor 21 turns off. For this reason, the controlled boosted potential Vpp' has the relationship of Vpp'=Vcc−Vthn; therefore, it is equal approximately to power supply potential Vcc. In other words, the well voltage VB has the relationship of VB=Vcc−Vthn; therefore, it is equal approximately to power supply potential Vcc. As a result, the PN junction between the source and well is prevented from being forward-biased; therefore, it is also prevented from turning on. Consequently, it is possible to prevent the influence on semiconductor elements.

In the well voltage generator circuit shown in FIG. 3, since the N-channel transistor 22 comprises a transistor having a low threshold voltage, when the boosted potential Vpp falls, and the N-channel transistor 22 turns on and the P-channel transistor 21 turns off, the controlled boosted potential Vpp', that is, well voltage VB is equal to the source potential Vcc of the N-channel transistor 22 (strictly, Vcc−Vthn). As a result, the PN junction between the source and well is prevented from being forward-biased; therefore, it is also prevented from turning on.

If the well voltage VB is lower than the source voltage VS, a slight charge may flow through the PN junction between source and well, even if the difference between well voltage VB and source voltage VS is less than the threshold voltage of the PN junction between source and well. However, a large number of carriers are not generated in the substrate. Thus, neither parasitic transistors latch up nor a large current flows therethrough. Therefore, no influence is given on elements.

The well voltage generator circuit shown in FIG. 3 is realized using a relatively simple configuration; therefore, it can be arranged in a small space, and it is effective in circuit arrangement. In addition, the well voltage generator circuit shown in FIG. 3 is located near a transistor 10; therefore, it is possible to reduce malfunction by signal delay and distribution, and it is effective in the circuit operation. Incidentally, the well voltage generator circuit shown in FIG. 3 may be located for each of several transistors 10, or one circuit may be located with respect to the entirety of several transistors 10.

(Second Embodiment)

Figure 4:
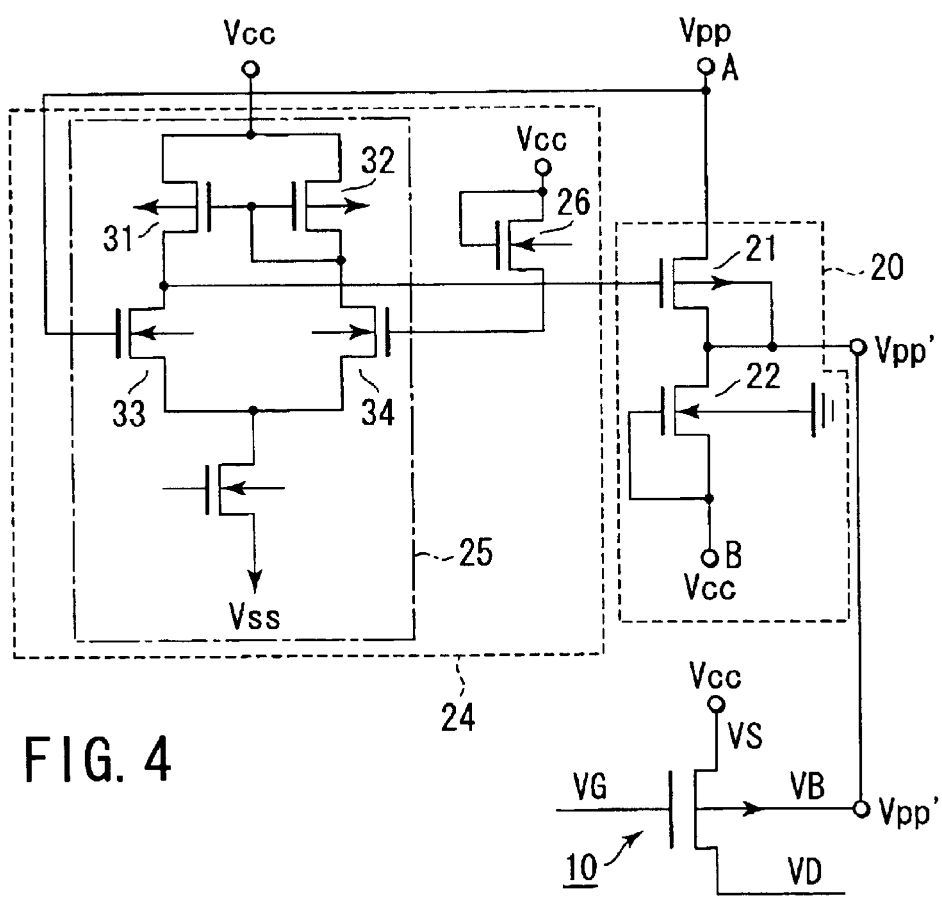
FIG. 4 is a circuit diagram showing a semiconductor device according to a second embodiment of the present invention.

FIG. 4 is a circuit diagram showing the semiconductor device according to a second embodiment of the present invention.

In semiconductor memory devices, a control circuit controlling memory cells is formed around the memory cells. The control circuit comprises elements such as a transistor or diode. Similarly to the first embodiment, the control circuit is composed of a P-channel transistor 10 shown in FIG. 1, for example. The P-channel transistor 10 is formed in a substrate or well formed in the substrate, and supplied with well voltage (back gate voltage) VB in addition to gate voltage VG, source voltage VS and drain voltage VD. The voltage VB is not limited to the well voltage, and a substrate voltage may be supplied.

As illustrated in FIG. 2, the P-channel transistor 10 comprises first semiconductor region 11, P-type second semiconductor regions 12, 13, and gate electrode 14. The first semiconductor region 11 is formed of an N-type well or N-type semiconductor substrate. The P-type second semiconductor regions 12 and 13 are formed in the first semiconductor region 11, and constitute source and drain regions of the P-channel transistor 10. The gate electrode 14 is formed on the first semiconductor region 11 via a gate insulating film. The gate electrode 14, second semiconductor regions 12, 13 and first semiconductor regions 11 are supplied with gate voltage VG, source voltage VS, drain voltage VD and well voltage VB, respectively.

Controlled boosted potential Vpp' is supplied as the well voltage VB of the P-channel transistor 10. A well voltage generator circuit shown in FIG. 4 generates the controlled boosted potential Vpp'. The well voltage generator circuit is provided with terminals A and B. The terminal A receives boosted potential Vpp supplied from a second power supply comprising a charge pump circuit (not shown) in the semiconductor memory device. On the other hand, the terminal B receives power supply potential Vcc supplied from a first power supply. The controlled boosted potential Vpp' is outputted from an output terminal. A potential switching circuit 20 is interposed between the terminals A and B. The potential switching circuit 20 has the configuration in which a P-channel transistor 21 and an N-channel transistor 22 are connected in series between the terminals A and B. The terminal A is provided with the P-channel transistor 21; on the other hand, the terminal B is provided with the N-channel transistor 22. The back gate and drain of the P-channel transistor 21 are interconnected. The source and gate of the N-channel transistor 22 are connected, that is, diode-connected.

The terminal A is connected with the source of the P-channel transistor 21, and the gate of the P-channel transistor 21 is connected with the output of a comparator circuit 24. The comparator circuit 24 comprises a differential amplifier circuit 25 including a current mirror circuit as a load. The current mirror circuit is composed of two P-channel transistors 31 and 32. The input section of the differential amplifier circuit 25 includes two differential transistors 33 and 34 each comprising an N-channel transistor. The input (gate) of the differential transistor 33 of the differential amplifier circuit is connected to the terminal A, and inputted with boosted potential Vpp. The input (gate) of the differential transistor 34 of the differential amplifier circuit is connected to the drain of an N-channel transistor 26, and inputted with potential Vcc−Vthn via the N-channel transistor 26. Vthn is the threshold value of the N-channel transistor 26. The potential Vcc−Vthn is generated when power supply potential Vcc is connected to the source of the N-channel transistor 26 having connected source and gate.

The terminal B is connected with the source of the N-channel transistor 22. The source and gate of the N-channel transistor 22 are interconnected, that is, diode-connected. The well voltage (back gate voltage) of the N-channel transistor 22 is reference voltage Vss; for example, ground potential. The voltage of the common drain of interconnected P-channel and N-channel transistors 21 and 22 is applied as well voltage VB to the well of the P-channel transistor 10. The threshold voltage Vthn of the N-channel transistor 22 is lower than the threshold voltage Vthp of the P-channel transistor 21. The threshold Vthn of the N-channel transistor 22 is about 0.2 V to 0.3 V, for example. The threshold Vthp of the P-channel transistor 21 is about 0.6 V, for example. N-channel transistor 22 of the potential switching circuit 20 and N-channel transistor 26 of the input section of the differential amplifier circuit 25 have substantially the same size and substantially the same threshold. P-channel and N-channel transistors 21 and 22 constituting the well voltage generator circuit are provided for generating the well voltage. The current flow rate is relatively low; therefore, the P-channel and N-channel transistors 21 and 22 form a low-consumption type circuit.

The operation of the well voltage generator circuit shown in FIG. 4 will be explained below. If the voltage Vpp of the terminal A is higher than the voltage Vcc of the terminal B, that is, Vpp≧Vcc−Vthn, the P-channel transistor 21 turns on while the N-channel transistor 22 turns off. Thus, the output voltage of the potential switching circuit 20, that is, the controlled boosted potential Vpp' is equal to Vpp (Vpp'=Vpp). Therefore, the well voltage VB is equal to Vpp (VB=Vpp).

For example, a great many cells are operated; for this reason, a large current flows through the power supply supplying the voltage Vpp to the terminal A, or noise is generated. In this case, the boosted potential Vpp becomes low. In the comparator circuit 24, when the boosted potential Vpp becomes low, and a difference occurs in the input voltage to differential transistors 33 and 34, the output current increases or decreases so that the current ratio of differential transistors 33 and 34 can be kept constant in the comparator circuit 24. The current from P-channel transistors 31 and 32 constituting the current mirror circuit is distributed to current flowing to differential transistors 33 and 34 and output current flowing to the out terminal. Therefore, the output current becomes constant regardless of the load connected to the output terminal. The difference of the input voltage to differential transistors 33 and 34 is the output voltage, and the amplification degree can be controlled from the external device.

The comparator circuit 24 outputs an "H" level when the boosted potential Vpp is lower than a predetermined level. More specifically, when Vpp is lower than Vcc−Vthn, the comparator circuit 24 outputs an "H" level. On the other hand, when boosted potential Vpp is higher than the predetermined level, the comparator circuit 24 outputs an "L" level. In other words, when Vpp is higher than Vcc−Vthn, the comparator circuit 24 outputs an "L" level. Thus, the boosted potential Vpp falls, and the N-channel transistor 22 comprising a transistor having a low threshold value turns on while the P-channel transistor 21 turns off. Therefore, the controlled boosted potential Vpp' has the relationship of Vpp'=Vcc−Vthn, that is, equal approximately to power supply potential Vcc. In other words, the well voltage VB has the relationship of VB=Vcc−Vthn; therefore, it is equal approximately to power supply potential Vcc. Since the N-channel transistor is formed of a transistor having a low threshold, the PN junction between the source and well is prevented from being forward-biased; therefore, it is also prevented from turning on.

In the well voltage generator circuit shown in FIG. 4, since the N-channel transistor comprises a transistor having a low threshold voltage, when the boosted potential Vpp falls, and the N-channel transistor 22 turns on and the P-channel transistor 21 turns off, the controlled boosted potential Vpp', that is, well voltage VB is equal to the source potential Vcc of the N-channel transistor 22 (strictly, Vcc−Vthn). As a result, the PN junction between the source and well is prevented from being forward-biased; therefore, it is also prevented from turning on. Consequently, it is possible to prevent the influence on semiconductor elements.

If the well voltage VB is lower than the source voltage VS, a slight charge may flow through the PN junction between source and well, even if the difference between well voltage VB and source voltage VS is less than the threshold voltage of the PN junction between source and well. However, a large number of carriers are not generated in the substrate. Thus, neither parasitic transistors latch up nor a large current flows therethrough. Therefore, no influence is given on elements.

With the embodiment, when the boosted potential Vpp falls and the N-channel transistor 22 comprising a transistor having a low threshold value turns on, the P-channel transistor 21 turns off. As the result, floating of the potential does not occur.

According to the embodiments described above, even if the boosted potential Vpp falls, the PN junction between source and well (or substrate) is prevented from being forward-biased, so that it can be prevented from turning on. As a result, it is possible to prevent the influence on semiconductor elements.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

a first transistor having a first conduction type first semiconductor region and a second conduction type second semiconductor region formed in the first semiconductor region, the first semiconductor region being supplied with a first prescribed potential, the second semiconductor region being supplied with a second prescribed potential; and a potential generator circuit generating the first prescribed potential, wherein;

the potential generator circuit has a first power supply terminal supplied with a first power supply potential, a second power supply terminal supplied with a second power supply potential set to a higher potential than the first power supply potential, and an output terminal outputting the first prescribed potential, and the potential generator circuit outputs the second power supply potential as the first prescribed potential when the second power supply potential is higher than a predetermined potential, and outputs the first power supply potential as the first prescribed potential when the second power supply potential is lower than the predetermined potential, wherein the potential generator circuit comprises:

a second transistor having a source connected to the second power supply terminal supplied with the second power supply potential, and a drain connected to the output terminal outputting the first prescribed potential;

a third transistor having source and gate connected to the first power supply terminal supplied with the first power supply potential, and a drain connected to the output terminal outputting the first prescribed potential; and an inverter circuit having an input terminal connected to the second power supply terminal, and an output terminal connected to the gate of the second transistor.

2. A semiconductor device according to claim 1, wherein the second transistor is formed of a P channel transistor, and the third transistor is formed of an N channel transistor.

3. A semiconductor device according to claim 2, wherein a threshold of the N channel transistor is lower than a voltage in which a PN junction becomes forward biased.

4. A semiconductor device according to claim 1, wherein when the second power supply potential is higher than the predetermined potential, the second transistor turns on, and the second power supply potential is outputted from the output terminal as the first prescribed potential, and when the second power supply potential is lower than the predetermined potential, the second transistor turns off and the third transistor turns on, and the first power supply potential is outputted from the output terminal as the first prescribed potential.

5. A semiconductor device according to claim 4, wherein the turn on and off of the second transistor is controlled by an output of the inverter circuit.

6. A semiconductor device comprising:

a first transistor having a first conduction type first semiconductor region and a second conduction type second semiconductor region formed in the first semiconductor region, the first semiconductor region being supplied with a first prescribed potential, the second semiconductor region being supplied with a second prescribed potential; and a potential generator circuit generating the first prescribed potential, wherein;

the potential generator circuit has a first power supply terminal supplied with a first power supply potential, a second power supply terminal supplied with a second power supply potential set to a higher potential than the first power supply potential, and an output terminal outputting the first prescribed potential, and the potential generator circuit outputs the second power supply potential as the first prescribed potential when the second power supply potential is higher than a predetermined potential, and outputs the first power supply potential as the first prescribed potential when the second power supply potential is lower than the predetermined potential, wherein the potential generator circuit comprises:

a second transistor having a source connected to the second power supply terminal supplied with the second power supply potential, and a drain connected to the output terminal outputting the first prescribed potential;

a third transistor having source and gate connected to the first power supply terminal supplied with the first power supply potential, and a drain connected to the output terminal outputting the first prescribed potential; and a comparator circuit including a differential. amplifier circuit having a pair of input terminals and an output terminal;

wherein one of said pair of input terminals of the differential amplifier circuit of the comparator circuit is connected with the second power supply terminal, the other thereof is connected with a source of a fourth transistor having drain and gate both connected to the first power supply terminal, and the output terminal of the differential amplifier circuit of the comparator circuit is connected to the gate of the second transistor.

7. A semiconductor device according to claim 6, wherein the second transistor is formed of a P channel transistor, the third transistor is formed of an N channel transistor, and the fourth transistor is formed of an N channel transistor.

8. A semiconductor device according to claim 7, wherein a threshold of the N channel transistor is lower than a voltage in which a PN junction becomes forward biased.

9. A semiconductor device according to claim 6, wherein the fourth transistor has substantially the same threshold as the third transistor.

10. A semiconductor device according to claim 6, wherein when the second power supply potential is higher than the predetermined potential, the second transistor turns on, and the second power supply potential is outputted from the output terminal as the first prescribed potential, and when the second power supply potential is lower than the predetermined potential, the third transistor turns on while the second transistor turns off, and the first power supply potential is outputted from the output terminal as the first prescribed potential.

11. A semiconductor device according to claim 10, wherein the turn on and off of the second transistor is controlled by an output of the differential amplifier circuit of the comparator circuit.

12. A semiconductor device comprising:

a first transistor having a first conduction type first semiconductor region and a second conduction type second semiconductor region formed in the first semiconductor region, the first semiconductor region being supplied with a first prescribed potential, the second semiconductor region being supplied with a second prescribed potential; and a potential generator circuit generating the first prescribed potential, wherein the potential generator circuit has a first power supply terminal supplied with a first power supply potential, a second power supply terminal supplied with a second power supply potential set to a higher potential than the first power supply potential, and an output terminal outputting the first prescribed potential, and the potential generator circuit comprises:

a second transistor having a source connected to the second power supply terminal supplied with the second power supply potential, and a drain connected to the output terminal outputting the first prescribed potential;

a third transistor having source and gate connected to the first power supply terminal supplied with the first power supply potential, and a drain connected to the output terminal outputting the first prescribed potential; and an inverter circuit having an input terminal connected to the second power supply terminal, and an output terminal connected to the gate of the second transistor.

13. A semiconductor device according to claim 12, wherein the first transistor is formed of a P channel transistor.

14. A semiconductor device comprising:

a first transistor having a first conduction type first semiconductor region and a second conduction type second semiconductor region formed in the first semiconductor region, the first semiconductor region being supplied with a first prescribed potential, the second semiconductor region being supplied with a second prescribed potential; and a potential generator circuit generating the first prescribed potential, wherein the potential generator circuit has a first power supply terminal supplied with a first power supply potential, a second power supply terminal supplied with a second power supply potential set to a higher potential than the first power supply potential, and an output terminal outputting the first prescribed potential, and the potential generator circuit comprises:

a second transistor having a source connected to the second power supply terminal supplied with the second power supply potential, and a drain connected to the output terminal outputting the first prescribed potential;

a third transistor having source and gate connected to the first power supply terminal supplied with the first power supply potential, and a drain connected to the output terminal outputting the first prescribed potential; and a comparator circuit including a differential amplifier circuit having a pair of input terminals and an output terminal;

wherein one of said pair of input terminals of the differential amplifier circuit of the comparator circuit is connected with the second power supply terminal, the other thereof is connected with a source of a fourth transistor having drain and gate both connected to the first power supply terminal, and the output terminal of the differential amplifier circuit of the comparator circuit is connected to the gate of the second transistor.

15. A semiconductor device according to claim 14, wherein the second transistor is formed of a P channel transistor, the third transistor is formed of an N channel transistor, and the fourth transistor is formed of an N channel transistor.

16. A semiconductor device according to claim 14, wherein the third transistor has a lower threshold than the second transistor.

17. A semiconductor device according to claim 14, wherein the fourth transistor has substantially the same threshold as the third transistor.

* * * * *